(12) United States Patent
Baggen

(10) Patent No.: US 7,487,429 B2
(45) Date of Patent: Feb. 3, 2009

(54) SIMPLE DECODING METHOD AND APPARATUS

(75) Inventor: Constant Paul Marie Jozef Baggen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 389 days.

(21) Appl. No.: 10/497,337

(22) PCT Filed: Nov. 26, 2002

(86) PCT No.: PCT/IB02/05016

§ 371 (c)(1),
(2), (4) Date: Jun. 1, 2004

(87) PCT Pub. No.: WO03/049297

PCT Pub. Date: Jun. 12, 2003

(65) Prior Publication Data

US 2005/0015701 A1    Jan. 20, 2005

(30) Foreign Application Priority Data

Dec. 6, 2001  (NL) .................................. 01204722

(51) Int. Cl.
  *H03M 13/00* (2006.01)
(52) U.S. Cl. ........................................ 714/777; 714/781
(58) Field of Classification Search .................. 714/793, 714/758, 759, 777, 781
See application file for complete search history.

(56) References Cited

U.S. PATENT DOCUMENTS 6,986,094 B2 * 1/2006 Grimsrud .................... 714/759

FOREIGN PATENT DOCUMENTS

| WO | 03093754 A1 | 11/2002 |
|---|---|---|
| WO | 03017499 A2 | 2/2003 |
| WO | 03049297 A2 | 6/2003 |

OTHER PUBLICATIONS

Stephen B. Wicker, Error Control Systems for Digital Communication and Storage pp. 117-120.*
By Martin Van Dijk et al. Entitled: Coding for Informed Decoders, ISIT2001, Washington, DC, Jun. 24-29, 2001, p. 1of1.
By Stephen B. Wicker, Entitled: "Error Control Systems for Digital Communication and Storage", School of Electrical and Computer Engineering, Georgia Institute of Technology, Library of Congress Cataloging-in Publication Data, ISBN 0-13-200809-2, 1995 by Prentice Hall, Inc. Simmon & Schuster/A Viacom Company, Upper Saddle River, New Jersey 07458. pp. 1-8.

* cited by examiner

*Primary Examiner*—M. Mujtaba K Chaudry
(74) *Attorney, Agent, or Firm*—Michael E. Belk

(57) ABSTRACT

A method of decoding possibly mutilated codewords (r) of a code (C) into information words (m') including information symbols (m'1, m'2, ..., m'k), the information words (m) being encoded into codewords (c) of the code (C). In order not to considerably deviate from the standard method and apparatus for decoding a standard Reed-Solomon code, a method of decoding is proposed including decoding the possibly mutilated codewords (r) into codewords (r'), reconstructing information symbols (m'1, m'2, ..., m'k) from the codewords (r'), comparing the reconstruct information symbols (m'1, m'2, ..., m'k) with information symbols (m1) known a priori before decoding, and verifying decoding errors based on the result of the comparison.

19 Claims, 3 Drawing Sheets

SIMPLE DECODING METHOD AND APPARATUS

The invention relates to a method and a corresponding apparatus for decoding possibly mutilated codewords of a code into information words and to a computer program implementing said method.

In European patent application EP 01 201 841.2 (PHNL 10331), the content of which is herein incorporated by reference, a method is described that allows to enhance the error correcting capabilities of an error correcting code (ECC) if some of the information symbols are known to the decoder. A possible application is in the field of address retrieval on optical media The sector address on optical media is part of a header which is protected by an error correcting code. Under many circumstances, much of the header information of the current sector can be inferred from the previously read sectors and the table of contents, or from the knowledge where the reading or writing head will approximately land.

In European patent application EP 01 203 147.2 (PHNL 10600), the content of which is also herein incorporated by reference, a method of encoding address words into codewords of a code is described. The described code provides an enhanced error correction power since it allows to benefit from approximate knowledge of the landing place of the reading or writing head even on places where many, or even all, bits of consecutive sector addresses change. This is achieved by encoding the address words into information words such that address words comprising addresses being close to each other share a plurality of information symbols and that said information words are then encoded into codewords using a generator matrix selected such that the minimum Hamming distance of at least one subcode of said code is larger than the minimum Hamming distance of said code and that a subcode generator matrix of said subcode derives from said generator matrix of said code by omitting the at least one row from said generator matrix corresponding to said at least one a priori known information symbol.

For decoding the codewords encoded according to the methods described in the above mentioned patent applications a standard Reed-Solomon (RS) decoder can not be used, but a special decoder has to be provided to make use of the enhanced error correction capabilities. Thus, standard playback or recording apparatuses can not make use of such a code or can not even decode it at all. Further, new decoders have to be designed and implemented in new playback or recording apparatuses.

It is therefore an object of the present invention to provide a method and apparatus for decoding such a code without the need to considerably deviate from the standard method and apparatus for decoding a standard Reed-Solomon code.

This object is achieved according to an embodiment by a method of decoding possibly mutilated codewords of a code into information words comprising information symbols, said information words being encoded into codewords of said code, according to claim 1, which comprises the steps of:

decoding said possibly mutilated codewords into codewords, reconstructing information symbols from said codewords, comparing said reconstruct information symbols with informationsymbols known a priori before decoding, and verifying decoding errors based on the result of said comparison.

An embodiment is based on the idea that based on the mathematical code properties it can still be identified in an error correcting code if there has been made a miscorrection using a standard RS decoder by comparing the reconstructed information symbols, i.e. the reconstructed user information, with the a priori known information symbols available at the decoder. If the decoder has made a correction error which is within the error correcting capabilities of the code, there is a high probability that there will appear discrepancies between the reconstructed information symbols and the a priori known information symbols leading to a negative verification result.

Embodiments are defined in the dependent claims. The reconstruction of information symbols can be implemented by some simple hardware, e.g. similar to the hardware used for syndrome formation.

An embodiment is generally applicable for any systematic code for the detection of correction errors. However, the embodiment can be applied for decoding code as described in the above mentioned European patent applications EP 01 201 841.2 (PHNL 10331) and EP 01 203 147.2 (PHNL 10600) which provide an extra Hamming distance if some information symbols are known a priori to the decoder. However, it is assumed that the encoder is not informed about which, if any, symbols are actually known to the decoder.

To get such an enhancement of the effective Hamming distance a certain predefined (i.e. previously selected) generator matrix is used. Said predefined generator matrix is then used for encoding and decoding, i.e. it needs to be used as a standard generator matrix. In other words, the generator matrix is selected such that the minimum Hamming distance of a subcode is larger than the minimum Hamming distance of the complete code.

The concept of using a generator matrix for encoding information words into codewords is widely used and known, e.g. from Richard E. Blahut "Theory and Practice of Error-Control Codes", Addison Wesley, May 1984, Sec. 3.2. Such a generator matrix is particularly used and described in standards, like the CD audio standard.

When using said predefined generator matrix, address information can be protected more reliably. If part of the address information, e. g. the most significant bits, is already known to the decoder if a new command to access a certain address on a data carrier, e.g. a disk, is given, address retrieval is more reliable which is especially important during writing. The decoder can then effectively use a subcode having an increased minimum Hamming distance. However, if no information symbols are known to the decoder a priori, decoding of the retrieved codeword is possible as usual and the Hamming distance of the code used will be the same as the Hamming distance of known codes, i.e. no subcode with a larger minimum Hamming distance can be used during decoding.

Address words are encoded into information words such that address words comprising addresses being close to each other share a plurality of information symbols. Such address words can be wobble addresses, e.g. addresses encoded in a secure subchannel known as wobble channel, as it is used in Digital Video Recording (DVR).

Because of address pre-processing during encoding, only one of the information symbols will change if an address is incremented, e.g. only one of the information symbols will change at a time when jumping from the inside to the outside of a disk. Therefore, if the jump accuracy is such that that the address of the actual landing place differs at most k from the address of the target landing place, at least k−1 information symbols will be known for every jump on a disk.

An apparatus for decoding a possibly mutilated codeword according to an embodiment is defined in claim 8. A computer program according to another embodiment for implementing the method is defined in claim 9.

An embodiment can be applied for decoding data read from a data carrier storing audio, video or software data, which data carrier might be of a recordable or rewriteable type, in particular an optical record carrier like a CD or a DVD. An application of the embodiment lies in the field of optical recording, as proposed in the standard for DVR (digital video recording), in the field of encoding wobble addresses in DVR.

The invention will now be further explained in more detail with reference to the drawings, in which:

FIG. 1 shows the typical scheme of codewords c of a [n, k] block code, e.g. a Reed-Solomon-Code. A codeword comprises an information word m comprising k information symbols and a parity word p comprising n-k parity symbols generated when encoding said information word m into a codeword c.

Figure 1:
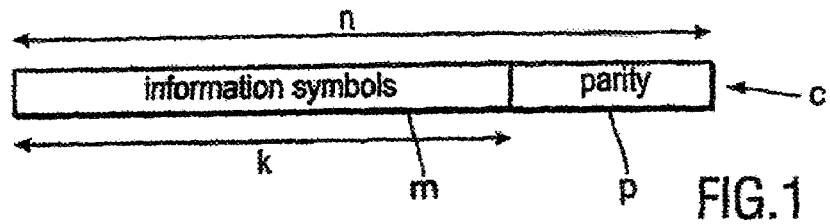
FIG. 1 shows the conventional format of a codeword.
Figure 2:
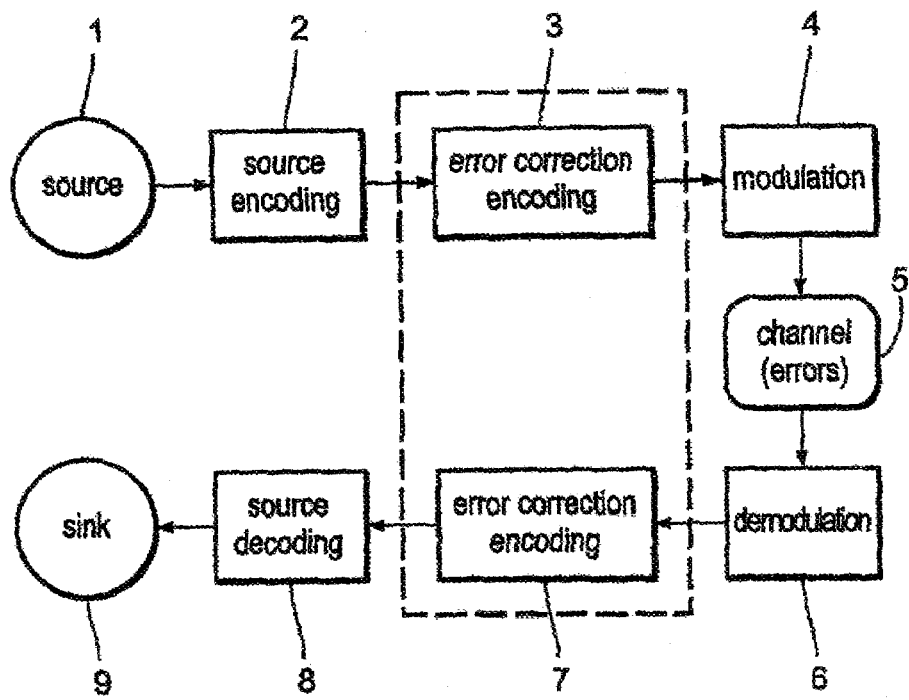
FIG. 2 shows a block diagram of the encoding and decoding scheme.

FIG. 2 shows a block diagram of a typical system using encoding and decoding. Therein user data, e.g. audio or video data, coming from a data source 1, e.g. recorded on a master tape or master disk, are encoded before they are stored on a data carrier, e.g. a disk, or transmitted over a transmission channel, e.g. over the internet, before they are again decoded for forwarding them to a data sink 9, e.g. for replaying them.

As can be seen the user data of the source 1 are first encoded by a source encoder 2, then error correction encoded by an ECC encoder 3 and thereafter modulated by a modulator 4, e.g. an EFM modulator, before the encoded user data—the codewords—are put on the channel 5 on which errors may be introduced into the codewords. The channel 5 shall here interpreted broadly, including a transmission channel as well as storage of the encoded data on a data carrier for a later replay.

When replay of data is intended, the encoded data first have to be demodulated by a demodulator 6, e.g. an EFM demodulator, before they are error correction decoded by an ECC decoder 7 and source decoded by a source decoder 8. Finally the decoded user data can be input to the sink 9, e.g. a player device for replay of the user data.

Such a general system is, however, not only used for encoding and decoding user data, but may as well be used for any kind of data like management data, in particular address data. Such address data are used to find a certain location on a data carrier or in a data stream of user data. On recordable or rewriteable disks such address data are generally prerecorded on the empty disks before any user data are recorded.

An embodiment refers to decoding of data. According to the embodiment a certain predetermined generator matrix is used. An application of the embodiment lies in the field of address retrieval of addresses used on optical record carriers.

Figure 3:
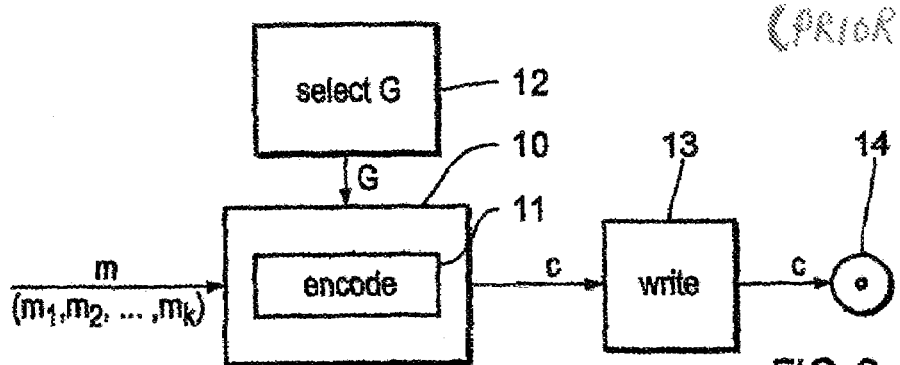
FIG. 3 shows a block diagram of an apparatus for encoding information words.

FIG. 3 shows an embodiment of an apparatus for encoding information words m as described in the above mentioned two European patent applications EP 01 201 841.2 (PHNL 10331) and EP 01 203 147.2 (PHNL 10600). Therein the encoding apparatus 10 comprises an encoding unit 11 for encoding the information words m comprising a fixed number of information symbols $m_1, m_2, \ldots, m_k$ into codewords c of a code C. To achieve an improved error correction capacity a certain predefined generator matrix G is used for encoding the information words m. This generator matrix G is selected and defined once by a selection unit 12 and then provided or preferably stored in the encoding apparatus 10 and the decoding apparatus for continuous use.

By use of the generator matrix G the information words m are thus encoded into codewords c by the encoding unit 11. These codewords c can be provided to a writing unit 13 recording the codewords c on an optical record carrier 14, e.g. on a CD or a DVD.

By way of an example the selection of the generator matrix G shall be explained in more detail. The example is based on the [7, 4, 3] binary Hamming code C generated by $g(x) = x^3 + x + 1$. At first the "normal" known use of the code shall be explained while thereafter the use of a code shall be explained.

Usually, the code C is used in systematic form, which corresponds to a generator matrix $$G_{sys} = \begin{pmatrix} 1 & 0 & 0 & 0 & 1 & 0 & 1 \\ 0 & 1 & 0 & 0 & 1 & 1 & 1 \\ 0 & 0 & 1 & 0 & 1 & 1 & 0 \\ 0 & 0 & 0 & 1 & 0 & 1 & 1 \end{pmatrix}$$

having four (in general k) rows and seven (in general n) columns. An information word $m = (m_1, m_2, m_3, m_4)$ is mapped onto the codeword $c = m \cdot G_{sys}$. If the i-th information symbol $m_i$ is known to the decoder prior to decoding, the decoder can subtract the contribution of $m_i$ to the received word r prior to decoding. This means that the decoder decodes the residual received word $r - m_i \cdot G_{sys}^i$, where $G_{sys}^i$ indicates the i-th row of $G_{sys}$, to a code where the i-th row is removed from the generator matrix $G_{sys}$. The knowledge of up to any three information bits does not alter significantly the correction capacity for the unknown information bits, since almost all subcodes C' of the code C obtained by deleting at most three rows of $G_{sys}$ still have Hamming distance three. Only if the information bits $m_1$, $m_3$ and $m_4$ are known, the Hamming distance for retrieving $m_2$ is increased to four.

According to an embodiment, another generator matrix $G_{id}$ for the same code C may be given as $$G_{id} = \begin{pmatrix} 1 & 1 & 1 & 1 & 1 & 1 & 1 \\ 0 & 1 & 0 & 0 & 1 & 1 & 1 \\ 1 & 1 & 0 & 1 & 0 & 0 & 1 \\ 1 & 1 & 1 & 0 & 1 & 0 & 0 \end{pmatrix} = \begin{pmatrix} g_1 \\ g_2 \\ g_3 \\ g_4 \end{pmatrix}.$$

If the (non-systematic) generator matrix $G_{id}$ is used for the encoding of the code C, an informed decoder as described in EP 01 201 841.2 (PHNL 10331) and EP 01 203 147.2 (PHNL 10600) can decode to more favourable subcodes C' of the code C if certain information bits or information symbols —an information symbol may comprise more than one bit —are known. For example, if the decoder knows the first information bit $m_1$ it can use the subcode C' generated by the last three rows $g_2, g_3, g_4$ of $G_{id}$, which corresponds to a [7, 3, 4] simplex code. As another example, if the last three bits $m_2, m_3, m_4$ are known to the decoder, it can exploit the subcode generated by the first row of $G_{id}$ which corresponds to the [7, 1, 7] repetition code, thus enabling the decoder to recover $m_1$ reliably even in the presence of three bit errors.

Figure 4:
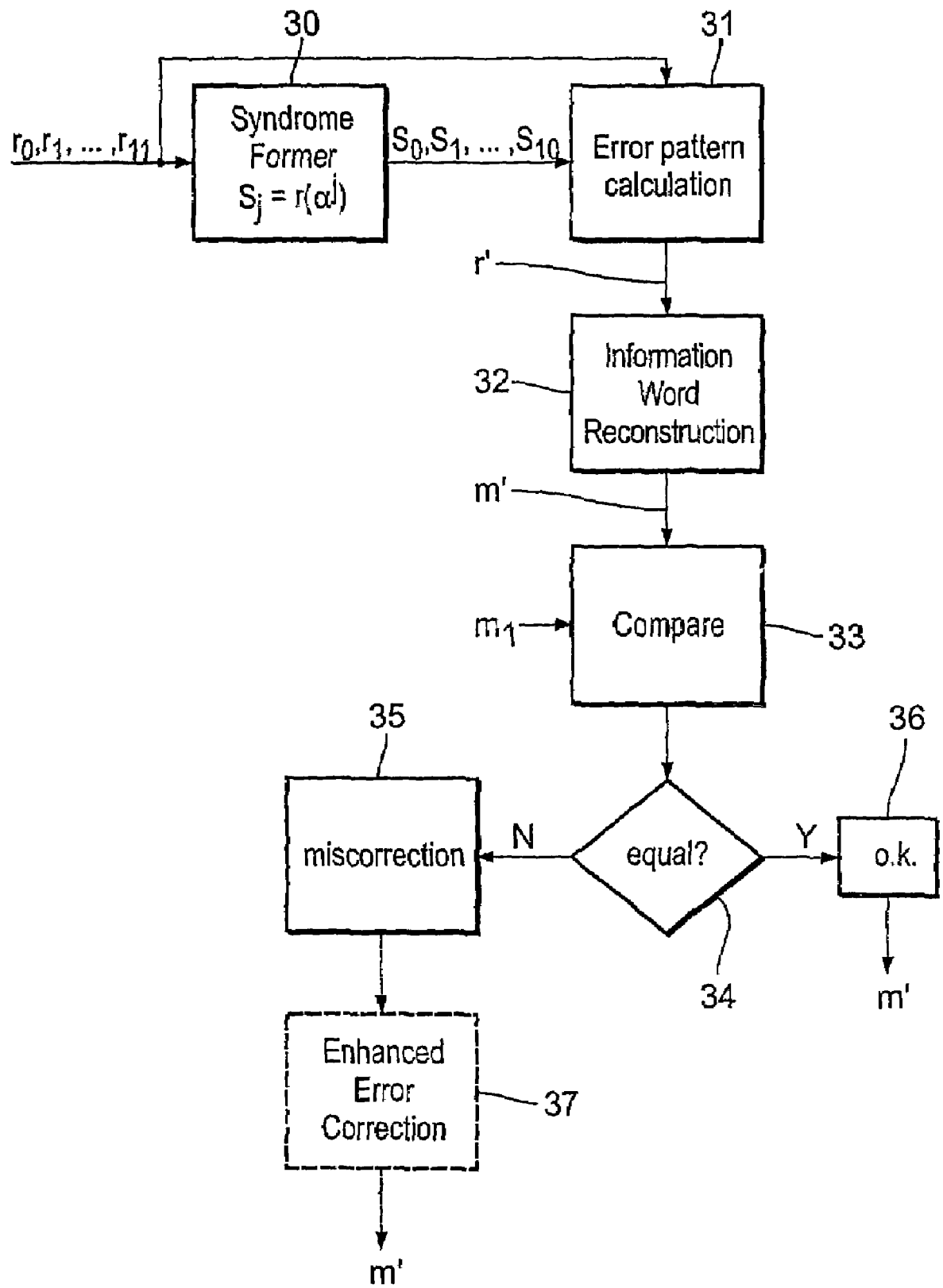
FIG. 4 shows a block diagram of an apparatus for decoding according to the invention.

An apparatus for decoding a read possibly mutilated codeword r is shown in FIG. 4. Therein the decoding apparatus receives the possibly mutilated codeword r. It is assumed that a received word r(x) comprising symbols $r_0, r_1, \ldots, r_{11}$ which has e.g. been read from a data carrier is a possibly mutilated codeword, i.e. includes a codeword c plus noise n. From the received word r syndromes $S_j$ are computed according to a known method in a syndrome forming unit 30 wherein it holds that $S_j=c(\alpha^j)+n(\alpha^j)=n(\alpha^j)$ for $0 \leq j \leq 4$ and $S_j=n(\alpha^j)+m_j$ for $5 \leq j \leq 10$. syndromes S as well as the received codewords r are then inputted into an error pattern calculation unit 31 of a known type for calculating error locations and error values to obtain the coefficients $r'_0, r'_1, \ldots, r'_{11}$ of the codeword r. In a practical realization said error pattern calculation unit 31 may comprise a unit for solving a key equation and a unit for implementing a Chien search and Forney algorithm. The units 30 and 31 together form a standard RS decoder.

The obtained codeword coefficients $r'_0, r'_1, \ldots, r'_{11}$ are then used to extract all information symbols $m'_1, m'_2, \ldots, m'_k$ in a reconstruction unit 32, e.g. by using a simple hardware for reconstruction, preferably similar to the unit 30 for syndrome formation.

Part of the obtained information symbols $m'_1, m'_2, \ldots, m'_k$ are thereafter compared to the a priori known information symbols, in the example to information symbol $m_1$, by comparator 33, i.e. the obtained information symbol $m'_1$ is compared to the a priori known information symbol $m_1$. This comparison allows a verification in unit 34 if any errors have been occurred during decoding since there is a high probability that there appear discrepancies between the reconstructed information symbols and the a priori known information symbols if decoding errors are made.

If the verification leads to a positive result (36) the reconstructed information symbols $m'_1, m'_2, \ldots, m'_k$ are outputted, while in the negative case (35) error correction could be repeated or, alternatively, an enhanced error correction could be performed taking into account the a priori known information symbols as described in EP 01 201 841.2 (PHNL 10331) and EP 01 203 147.2 (PHNL 10600) using a special informed decoder 37, finally generating the correct information symbols $m'_1, m'_2, \ldots, m'_k$.

For further detail regarding different methods of encoding leading to different codes providing an enhanced error correcting capability reference is made to EP 01 201 841.2 (PHNL 10331) and EP 01 203 147.2 (PHNL 10600). For decoding of all these codes the invention is applicable.

Figure 5:
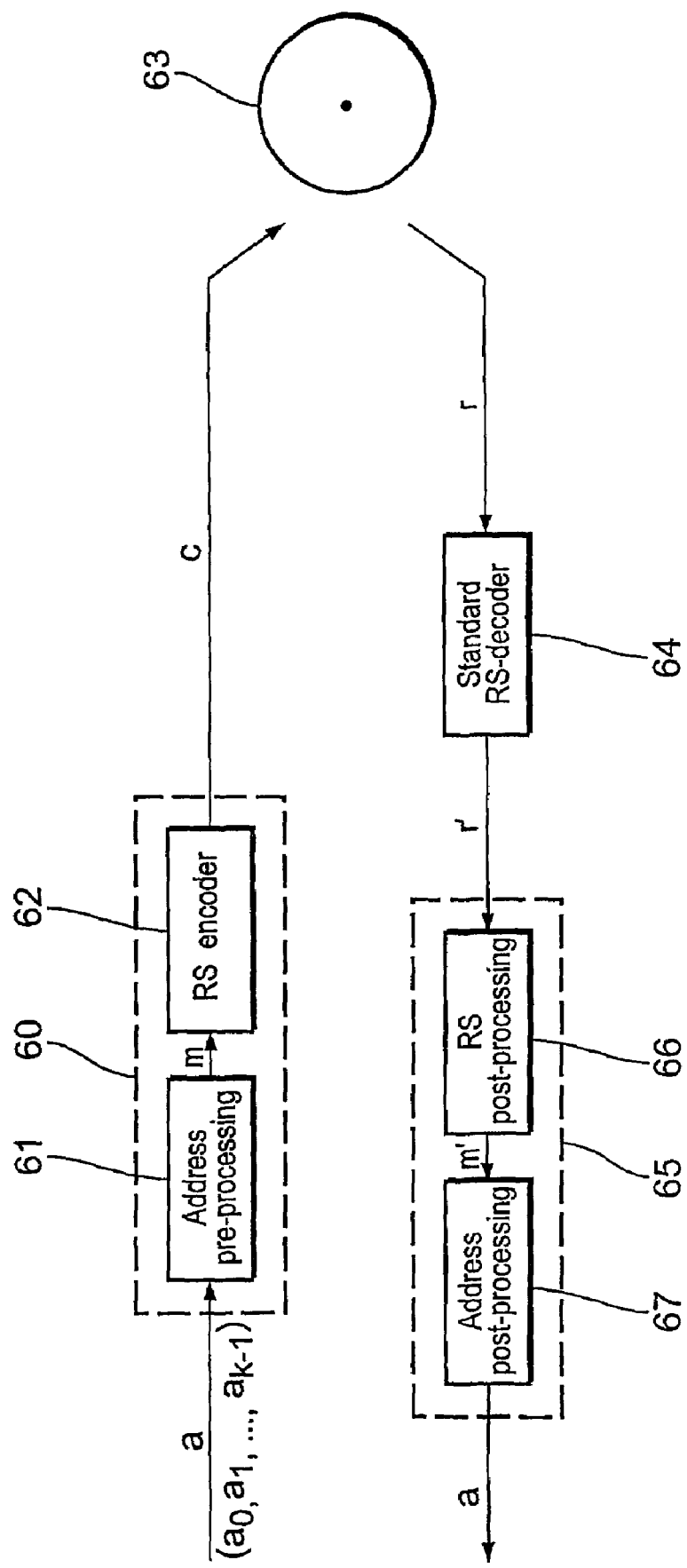
FIG. 5 shows a block diagram of another embodiment of the encoding and decoding scheme according to the invention.

A block diagram of another embodiment of the encoding and decoding scheme is shown in FIG. 5. Therein address words a comprising k address symbols $a_0, a_1, \ldots, a_{k-1}$ are fed into an encoder 60 comprising an address pre-processing unit 61 and an RS encoder 62. By the address preprocessing unit 61 the address words a are encoded into information words m comprising k information symbols $m_0, m_1, \ldots, m_{k-1}$ such that only one information symbol changes at a time when the address is incremented. This can be is achieved by applying a Gray Code inverting an information symbol $a_i$ when the least significant bit of the previous symbol $a_{i-1}$ has bit value one. The information words m are thereafter encoded into codewords c by the RS encoding unit 62.

The decoding method for the present ECC scheme is almost similar to the situation where a usual (systematic) RS code is used. If a possibly mutilated codeword r is read from the data carrier 63 (or is received via a transmission line) it is first decoded by a standard RS decoder 64. In this particular way of decoding, the knowledge of some information symbols is only (implicitly) used as an additional check after decoding. It is also possible to use this knowledge by trying to correct more errors than can be done without this knowledge as explained above.

The obtained intermediate codewords r' are then input into a post-processing unit 65 comprising an RS post-processing unit 66 and an address post-processing unit 67. In the RS post-processing unit 66 the information symbols $m'_i$ can be obtained by evaluating the intermediate codeword r' in the zero corresponding to the information symbol, i.e. by syndrome calculation. In the address post-processing unit 67 the address words a can thereafter be obtained from the information symbols m'. The post-processing unit 67 therein corresponds to elements 32 to 37 of the apparatus shown in FIG. 4.

The advantage of using the described ECC scheme is that the distance of the code can be increased when part of the address is known before decoding. It is however a drive option to actually use this prior knowledge. If this knowledge is not there this step can be skipped, which gives the usual decoding procedure with some post-processing to calculate the address from the intermediate codeword. The invention is particularly applicable for decoding codewords into which addresses are encoded, preferable wobble addresses as used in Digital Video Recording (DVR). Therein a [15,9,7] RS code is preferably used. Regarding more details of certain applications, reference is made to EP 01 203 147.2 (PHNL 10600).

The invention claimed is:

1. Method of decoding possibly mutilated codewords (r) of a code (C) into information words (m') comprising information symbols ($m'_1, m'_2, \ldots, m'_k$), said information words (m') being encoded into codewords (c) of said code (C), comprising the steps of:

providing a mechanism having a minimum Hamming distance for at least one subcode (C') of said code (C) that is larger than the minimum Hamming distance of said code (C), wherein said information words (m') are encoded into said codewords (c) using said mechanism;

decoding said possibly mutilated codewords (r) into codewords (r'), reconstructing information symbols ($m'_1, m_2, \ldots, m'_k$) from said codewords (r'), comparing said reconstruct information symbols ($m'_1, m'_2, \ldots, m'_k$) with information symbols ($m_1$) known a priori before decoding, and verifying decoding errors based on the result of said comparison.

2. Method according to claim 1, wherein said information symbols are reconstructed by syndrome forming.

3. Method according to claim 1, wherein said information words (m') are encoded into said codewords (c) using a generator matrix (G) providing an enhanced error correction capability if at least one information symbol ($m'_1$) is known a priori before decoding.

4. Method according to claim 3, wherein said generator matrix (G) is selected such that the minimum Hamming distance of at least one subcode (C') of said code (C) is larger than the minimum Hamming distance of said code (C) and that a subcode generator matrix (G') of said subcode (C') derives from said generator matrix (G) of said code (C) by omitting the at least one row from said generator matrix (G) corresponding to said at least one a priori known information symbol ($m'_1$,).

5. Method according to claim 3, wherein the contribution of said at least one a priori known information symbol ($m_1$) included in said possibly mutilated codeword (r) is taken into account for decoding said possibly mutilated codeword (r) with enhanced error correcting capabilities.

6. Method according to claim 1, wherein address word (a) are encoded into said information symbols (in) such that address words (a1) comprising addresses being close to each other share a plurality of information symbols.

7. Method according to claim 6, wherein said method is used for encoding address words used in Digital Video Recording (DVR), in particular for encoding address words of wobble addresses.

8. Apparatus for decoding possibly mutilated codewords (r) of a code (C) into information words (m') comprising information symbols ($m'_1$, $m'_2$, ..., $m'_k$), said information words (m') being encoded into codewords (c) of said code (C), wherein a mechanism having a minimum Hamming distance for at least one subcode (C') of said code (C) that is larger than the minimum Hamming distance of said code (C), wherein said information words (m') are encoded into said codewords (c) using said mechanism; comprising:
- means for decoding said possibly mutilated codewords (r) into codewords (r'),
- means for reconstructing information symbols ($m'_1$, $m'_2$, ..., $m'_k$) from said codewords (r'),
- means for comparing said reconstruct information symbols ($m'_1$, $m'_2$, ..., $m'_k$) with information symbols ($m_1$) known a priori before decoding, and
- means for verifying decoding errors based on the result of said comparison.

9. Computer code executable on a computer to perform the steps of the method of claim 1.

10. The apparatus according to claim 8, wherein said information symbols are reconstructed by syndrome forming.

11. The apparatus according to claim 8, wherein said information words (m') are encoded into said codewords (c) using a generator matrix (G) providing an enhanced error correction capability if at least one information symbol ($m'_1$) is known a priori before decoding.

12. The apparatus according to claim 11, wherein said generator matrix (G) is selected such that the minimum Harmning distance of at least one subcode (C') of said code (C) is larger than the minimum Hamming distance of said code (C) and that a subcode generator matrix (G') of said subcode (C') derives from said generator matrix (G) of said code (C) by omitting the at least one row from said generator matrix (G) corresponding to said at least one a priori known information symbol ($m'_1$,).

13. The apparatus according to claim 11, wherein the contribution of said at least one a priori known information symbol ($m_1$) included in said possibly mutilated codeword (r) is taken into account for decoding said possibly mutilated codeword (r) with enhanced error correcting capabilities.

14. The apparatus according to claim 8, wherein address word (a) are encoded into said information symbols (m) such that address words (a1) comprising addresses being close to each other share a plurality of information symbols.

15. The apparatus according to claim 14, wherein said method is used for encoding address words used in Digital Video Recording (DVR), in particular for encoding address words of wobble addresses.

16. A method of decoding codewords (r) of a code (C) into information words (m') including information symbols ($m'_1$, $m'_2$, ..., $m'_k$), said information words (m') being encoded into codewords (c) of said code (C), wherein said information words (m') are encoded into said codewords (c) using a generator matrix (G) comprising the steps of:
- decoding said codewords (r) into codewords (r'),
- reconstructing information symbols ($m'_1$, $m'_2$, ..., $m'_k$) from said codewords (r'),
- comparing said reconstruct information symbols ($m'_1$, $m'_2$, ..., $m'_k$) with at least one information symbol known before decoding, and
- verifying decoding errors based on the result of said comparison,
- wherein said generator matrix (G) is selected such that the minimum Hamming distance of at least one subcode (C') of said code (C) is larger than the minimum Hamming distance of said code (C) and that a subcode generator matrix (G') of said subcode (C') derives from said generator matrix (G) of said code (C) by omitting the at least one row from said generator matrix (G) corresponding to said at least one known information symbol ($m'_1$,).

17. The method according to claim 16, wherein said information symbols are reconstructed by syndrome forming.

18. The method according to claim 16, wherein the contribution of said at least one known information symbol ($m_1$) included in said possibly mutilated codeword (r) is taken into account for decoding said possibly mutilated codeword (r) with enhanced error correcting capabilities.

19. The method according to claim 16, wherein address word (a) are encoded into said information symbols (m) such that address words (a1) comprising addresses being close to each other share a plurality of information symbols.

* * * * *